(12) United States Patent
Lin et al.

(10) Patent No.: US 10,892,238 B2
(45) Date of Patent: Jan. 12, 2021

(54) CIRCUIT STRUCTURE AND CHIP PACKAGE

(71) Applicants: Global Unichip Corporation, Hsinchu (TW); Taiwan Semiconductor Manufacturing Co., Ltd., Hsinchu (TW)

(72) Inventors: Yuan-Hung Lin, Hsinchu (TW); Sheng-Fan Yang, Hsinchu (TW); Yu-Cheng Sun, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/413,623

(22) Filed: May 16, 2019

(65) Prior Publication Data

US 2020/0303330 A1 Sep. 24, 2020

(30) Foreign Application Priority Data

Mar. 21, 2019 (TW) .............................. 108109841 A

(51) Int. Cl.
*H01L 23/58* (2006.01)
*H01L 23/66* (2006.01)
*H01L 23/498* (2006.01)
*H01L 23/00* (2006.01)

(52) U.S. Cl.
CPC ........ *H01L 23/66* (2013.01); *H01L 23/49811* (2013.01); *H01L 23/49827* (2013.01); *H01L 23/49838* (2013.01); *H01L 24/16* (2013.01); *H01L 2223/6616* (2013.01);
(Continued)

(58) Field of Classification Search
CPC ............ H01L 23/498; H01L 23/49811; H01L 23/49827; H01L 23/49838
See application file for complete search history.

(56) References Cited

U.S. PATENT DOCUMENTS 9,666,544 B2   5/2017 Zu et al.
2016/0056127 A1* 2/2016 Lee .................. H01L 23/49811
257/659
(Continued)

FOREIGN PATENT DOCUMENTS

CN   101154644   4/2008
TW   I426834    2/2014
TW   I497667    8/2015

*Primary Examiner* — Phuc T Dang
(74) *Attorney, Agent, or Firm* — JCIPRNET

(57) ABSTRACT

A circuit structure including a first signal line and a second signal line is provided. The first signal line includes a first line segment, a first ball grid array pad, and a first through hole disposed between the first line segment and the first ball grid array pad. The second signal line includes a second line segment, a second ball grid array pad, and a second through hole disposed between the second line segment and the second ball grid array pad. In a plan view, a line connecting the center of the first ball grid array pad and the center of the second ball grid array pad has a first distance, a line connecting the center of the first through hole and the center of the second through hole has a second distance, and the first distance is less than the second distance. A chip package is also provided.

18 Claims, 8 Drawing Sheets

(52) U.S. Cl.
CPC ............. *H01L 2223/6638* (2013.01); *H01L 2224/16227* (2013.01); *H01L 2924/30111* (2013.01)

(56) References Cited

U.S. PATENT DOCUMENTS

2016/0372412 A1* 12/2016 Choi ................ H01L 23/49838
2017/0170108 A1*  6/2017 Wong ................ B23K 35/0244

* cited by examiner

CIRCUIT STRUCTURE AND CHIP PACKAGE

CROSS-REFERENCE TO RELATED APPLICATION

This application claims the priority benefit of Taiwan application serial no. 108109841, filed on Mar. 21, 2019. The entirety of the above-mentioned patent application is hereby incorporated by reference herein and made a part of this specification.

BACKGROUND

Technical Field

This invention relates to an electronic component, and in particular relates to a circuit structure and a chip package.

Description of Related Art

In high-speed and high-frequency signal transmission, the conductor used to transmit the signal needs to be designed with good impedance matching to reduce the reflection caused by impedance mismatch, that is, to reduce the insertion loss and relatively increase the return loss during signal transmission, and can improve the quality of the signal transmission.

SUMMARY

The invention provides a circuit structure and a chip package which have better signal transmission quality.

According to an embodiment of the invention, a circuit structure includes a first signal line and a second signal line. The first signal line includes a first line segment, a first ball grid array pad, and a first through hole. The first through hole is disposed between the first line segment and the first ball grid array pad. The second signal line includes a second line segment, a second ball grid array pad, and a second through hole. The second through hole is disposed between the second line segment and the second ball grid array pad. In a top view direction, a line connecting the center of the first ball grid array pad and the center of the second ball grid array pad has a first distance, a line connecting the center of the first through hole and the center of the second through hole has a second distance, and the first distance is less than the second distance.

In an embodiment of the invention, the first ball grid array pad, the second ball grid array pad, the first through hole, and the second through hole are disposed between the first line segment and the second line segment.

In an embodiment of the invention, in the top view direction, the center of the first ball grid array pad does not overlap the center of the first through hole, and the center of the second ball grid array pad does not overlap the center of the second via hole.

In an embodiment of the invention, the circuit structure further includes a ground via. The ground via is disposed between the first signal line and the second signal line.

In an embodiment of the invention, in the top view direction, the ground via is disposed on a line connecting the center of the first through hole and the center of the second through hole.

In an embodiment of the invention, the line structure further includes a third signal line and a fourth signal line. The third signal line and the first signal line form a first differential pair. The fourth signal line and the second signal line form a second differential line pair.

In an embodiment of the invention, the first differential pair is capable of transmitting a transmission signal having a frequency in a range of 1 GHz to 30 GHz, and the second differential pair is capable of transmitting a transmission signal having a frequency in a range of 1 GHz to 30 GHz.

In an embodiment of the invention, the circuit structure further includes a core layer. The first through hole and the second through hole penetrate the core layer.

In an embodiment of the invention, the first signal line further includes a conductive via. The conductive via is disposed between the first through hole and the first line segment, and the thickness of the first through hole is greater than the thickness of the conductive via.

In an embodiment of the invention, the first signal line further includes a conductive via. The conductive via is disposed between the first through hole and the first ball grid array pad, and the thickness of the first through hole is greater than the thickness of the conductive via.

According to an embodiment of the invention, a chip package includes a chip, the aforementioned circuit structure, and a plurality of conductive terminals. The chip has an active surface. The circuit structure is disposed on the active side of the chip. The circuit structure is electrically connected to the chip. The conductive terminals are disposed on the first ball grid array pad and the second ball grid array pad of the circuit structure.

Based on the above, the circuit structure and the chip package having the same of the present invention may have better signal transmission quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
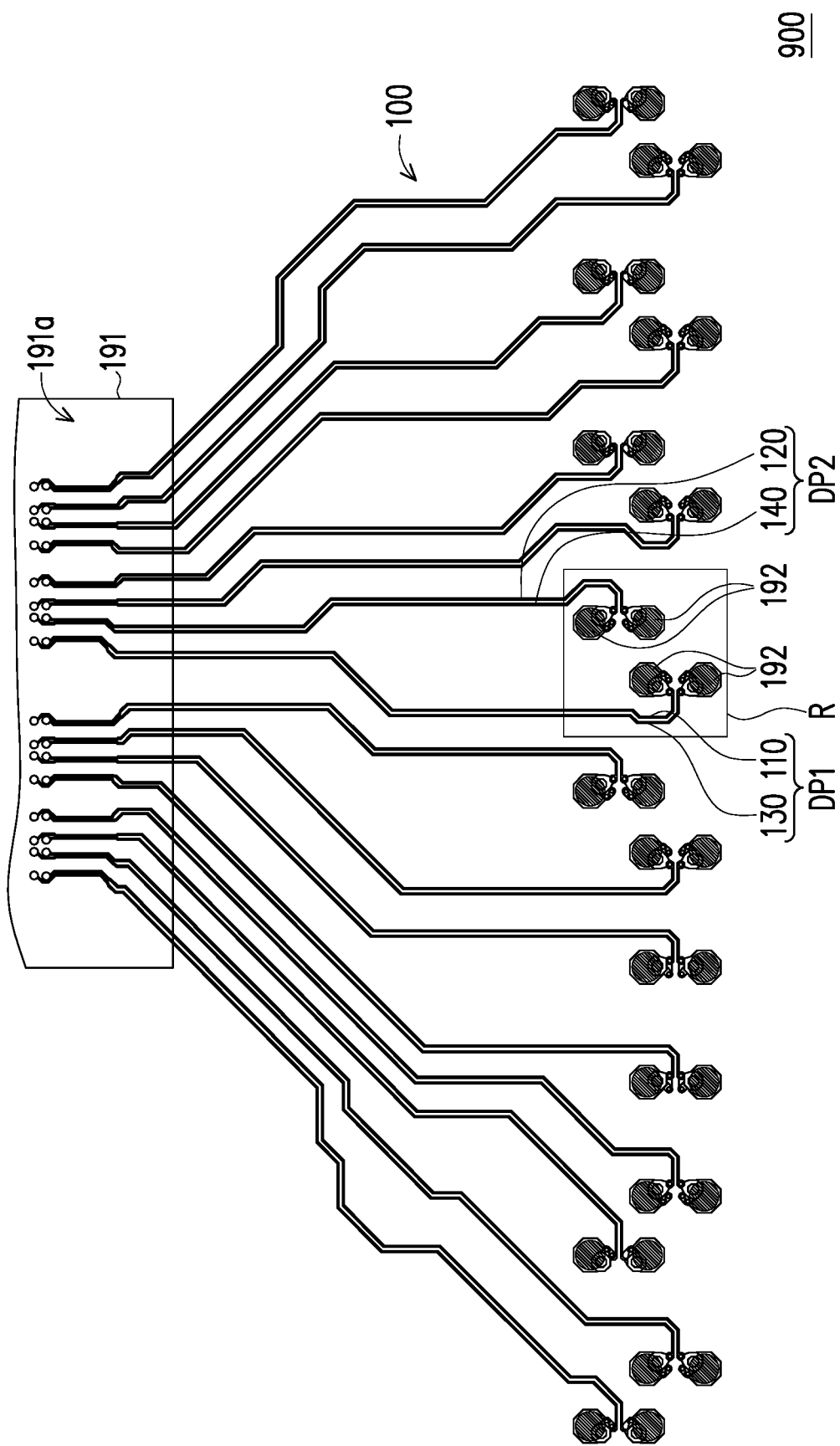
FIG. 1 is a partial top view of a chip package according to an embodiment of the invention.

The invention may be more fully described below with reference to the drawings of the embodiments. However, the invention may be embodied in a variety of different forms and should not be limited to the embodiments described herein. The thickness of layers and regions in the drawings may be exaggerated for clarity. Identical or similar elements are given identical or similar reference numerals in any of the following embodiments. In this regard, directional terminology, such as up, down, left, right, top, bottom, etc., may be used with reference to the orientation of the Figure(s) being described. The components provided in one or some embodiments of the invention may be positioned in a number of different orientations. As such, the directional terminology may be used for purposes of illustration and is in no way limiting.

FIG. 1 is a partial top view of a chip package according to an embodiment of the invention.

Referring to FIG. 1, the chip package 900 includes a chip 191, a circuit structure 100, a molding compound (not shown), and a plurality of conductive terminals 192. The chip 191 has an active surface 191a. The chip 191 is disposed on the circuit structure 100 with its active surface 191a facing the circuit structure 100. The circuit structure 100 is electrically connected to the chip 191. The molding compound may be disposed on the circuit structure 100 and encapsulate the chip 191. The conductive terminal 192 is disposed on the circuit structure 100 and electrically connected to the circuit structure 100. The circuit structure 100 is disposed between the chip 191 and the conductive terminals 192.

In the embodiment, the conductive terminals 192 may be metal conductive balls (e.g., solder balls), and the conductive terminals 192 may be arranged in an array. For example, the chip package may be a flip chip ball grid array (FCBGA) package. In general, in a flip chip ball grid array package, the position of the metal conductive ball (e.g., conductive terminal 192) can be configured according to the specifications of the product.

In the embodiment, the circuit structure 100 may include a plurality of differential pairs (e.g., differential pairs DP1 and DP2). In structural design, the differential pair may include two signal lines, and the layouts of the aforementioned two signal lines are substantially the same or similar. That is to say, the lengths of the aforementioned two signal lines are substantially similar, and the patterns of the aforementioned two signal lines are substantially similar. In signal transmission, a differential signaling may be transmitted via differential routing pairs in the form of complementary signal. The complementary signal consists of a negative signal and a positive signal.

With the above configuration, the circuit structure (e.g., the circuit structure 100 or the circuit structure similar to the circuit structure 100) may be adapted to the transmission of high frequency signals. It should be noted that the above-mentioned circuit structure is not limited to be used for the transmission of high frequency signals.

It should be noted that in the chip package 900 of the present embodiment, the circuit structure included is exemplified by the circuit structure 100. In other embodiments not shown, the circuit structure of the chip package may be a circuit structure similar to the circuit structure 100 (e.g., the circuit structure 200 illustrated in FIG. 5).

A circuit structure 100 or a circuit structure 200 of an embodiment of the present invention is described in detail below.

Figure 2:
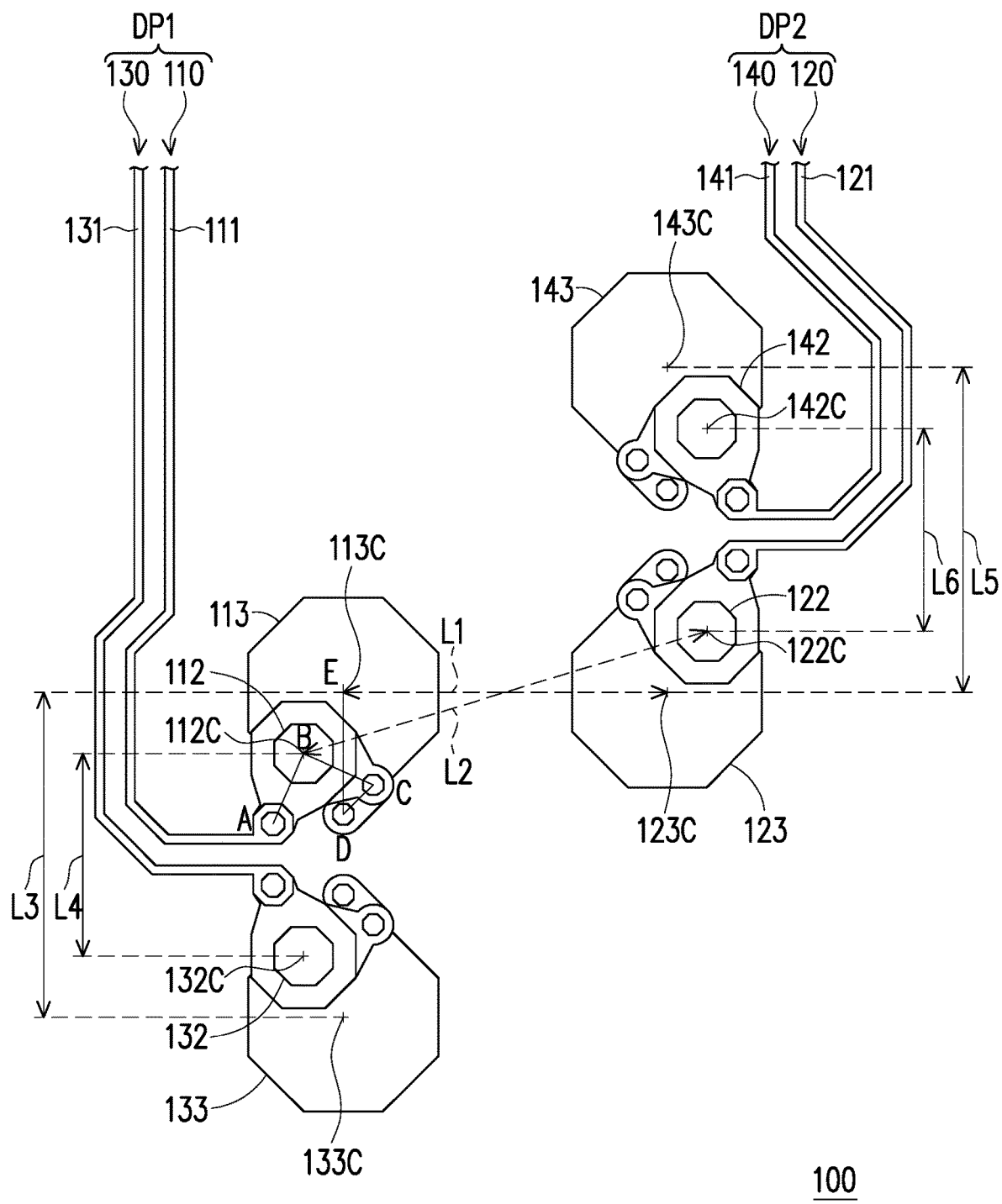
FIG. 2 is a partial top view of a circuit structure according to a first embodiment of the invention.
Figure 3:
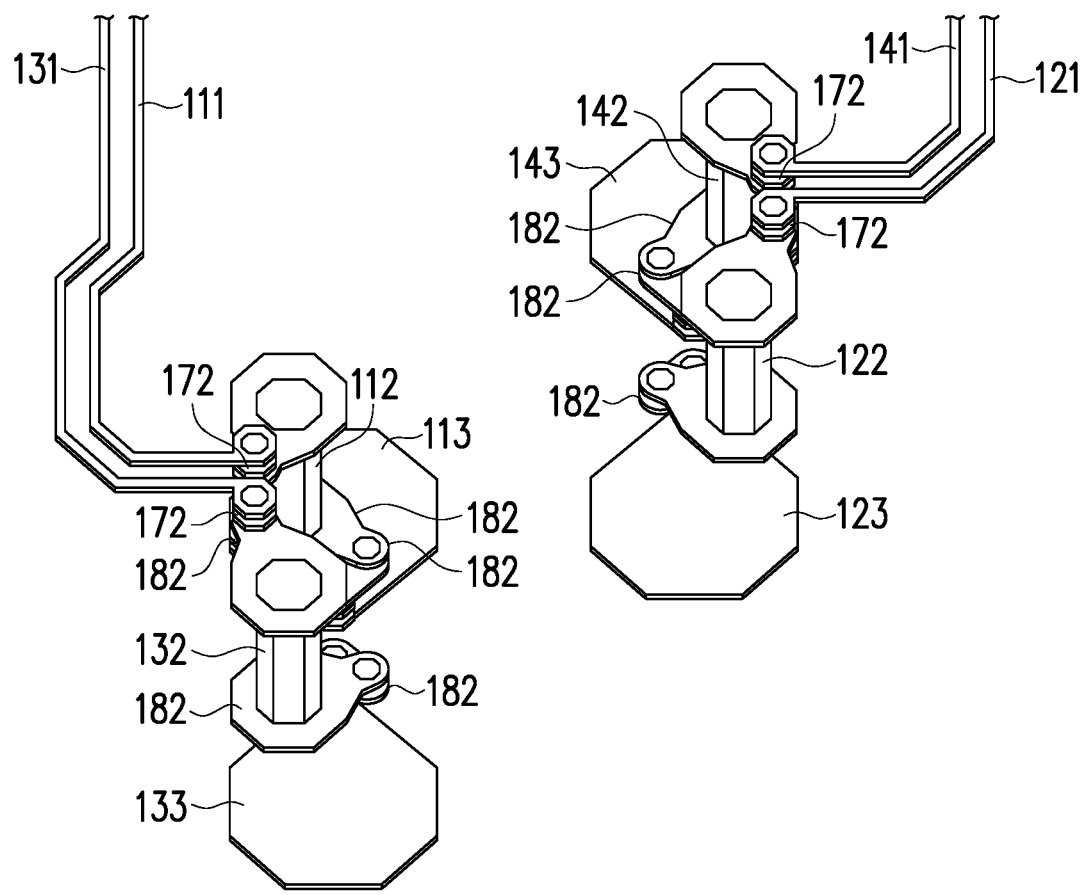
FIG. 3 is a partial perspective view of a circuit structure according to a first embodiment of the invention.
Figure 4:
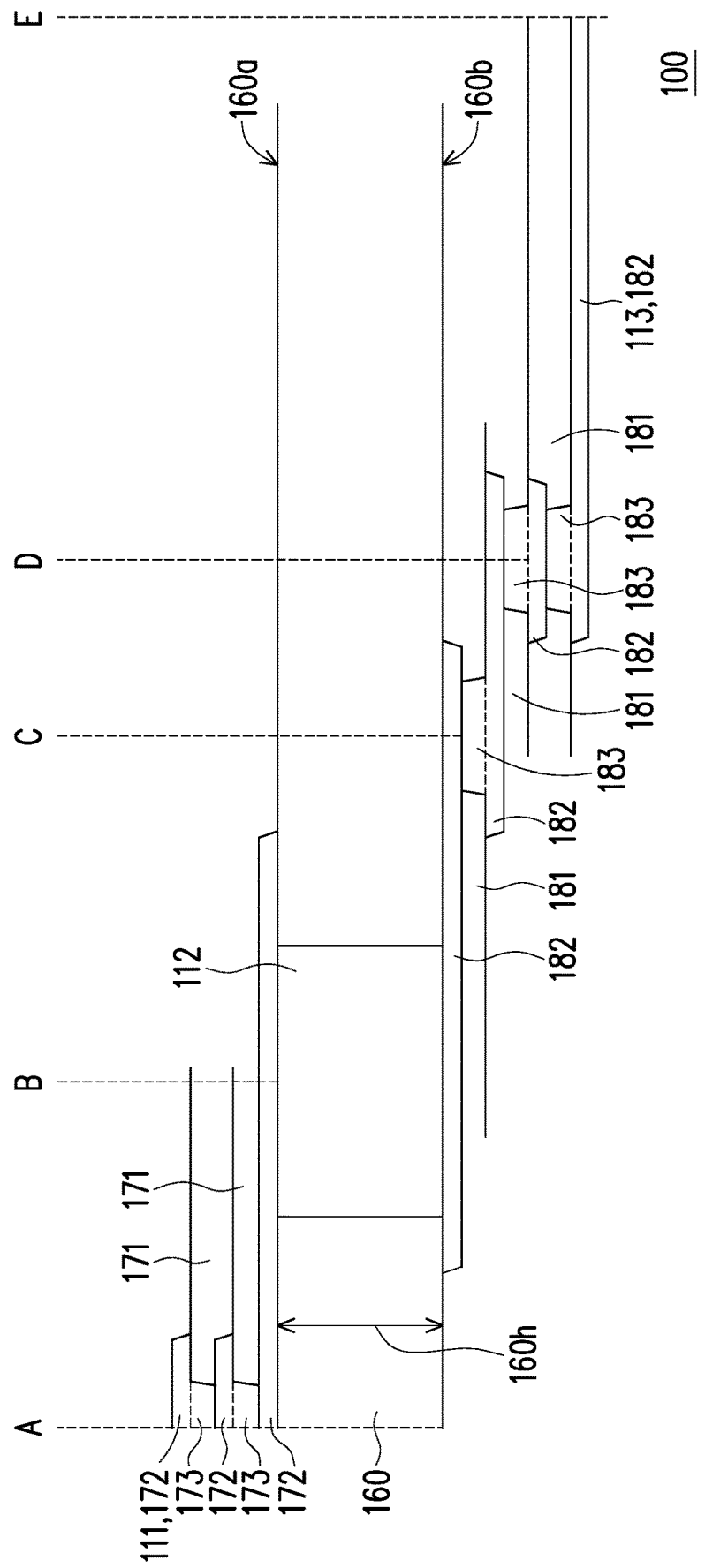
FIG. 4 is a partial cross-sectional view of a circuit structure according to a first embodiment of the invention.

FIG. 2 is a partial top view of a circuit structure according to a first embodiment of the invention. FIG. 3 is a partial perspective view of a circuit structure according to a first embodiment of the invention. FIG. 4 is a partial cross-sectional view of a circuit structure according to a first embodiment of the invention. FIG. 2 may be an enlarged schematic view showing a part of the circuit structure of the region R in FIG. 1. FIG. 3 may be a perspective view of FIG. 2. FIG. 4 may be a cross-sectional view along the line connecting the A-B-C-D-E points in FIG. 2. Further, a part of the film layer and element are omitted in FIGS. 2, 3, and 4 for clarity. For example, in FIG. 2 and FIG. 3, a part of the insulating film layer and the element are omitted. For example, in FIG. 4, a partial film layer disposed on the first surface 160a of the core layer 160 is omitted in a partial cross-sectional view of the line connecting the B-C-D-E, a partial film layer disposed on the second surface 160b of the core layer 160 (below the mark of the second surface 160b in FIG. 4) is omitted in a partial cross-sectional view of the line connecting the A-B-C-D point.

In the embodiment, the first signal line 110 includes a first line segment 111, a first through hole 112, and a first ball grid array pad 113. The first through hole 112 is disposed between the first line segment 111 and the first ball grid array pad 113, and the first through hole 112 is electrically connected to the first line segment 111 and the first ball grid array pad 113. The second signal line 120 includes a second line segment 121, a second through hole 122, and a second ball grid array pad 123. The second through hole 122 is disposed between the second line segment 121 and the second ball grid array pad 123, and the second through hole 122 is electrically connected to the second line segment 121 and the second ball grid array pad 123. The third signal line 130 includes a third line segment 131, a third through hole 132, and a third ball grid array pad 133. The third through hole 132 is disposed between the third line segment 131 and the third ball grid array pad 133, and the third through hole 132 is electrically connected to the third line segment 131 and the third ball grid array pad 133. The fourth signal line 140 includes a fourth line segment 141, a fourth through hole 142, and a fourth ball grid array pad 143. The fourth through hole 142 is disposed between the fourth line segment 141 and the fourth ball grid array pad 143, and the fourth through hole 142 is electrically connected to the fourth line segment 141 and the fourth ball grid array pad 143.

In the embodiment, in a top view direction (as shown in FIG. 2, or a direction from the first surface 160a to the second surface 160b of the core layer 160), the line connecting the center 113C of the first ball grid array pad 113 and the center 123C of the second ball grid array pad 123 has a first distance L1, the line connecting the center 112C of the first through hole 112 and the center 122C of the second through hole 122 has a second distance L2, and the first distance L1 is smaller than the second distance L2. In this way, when the high-frequency signal transmission is performed by the circuit structure 100, the signal interference between the first signal line 110 and the second signal line 120 may be reduced.

In the embodiment, in a top view direction, the first ball grid array pad 113, the second ball grid array pad 123, the first through hole 112, and the second through hole 122 are disposed between the first line segment 111 and the second line segment 121.

In the embodiment, in a top view direction, the center 113C of the first ball grid array pad 113 does not overlap the center 112C of the first through hole 112, and the center 123C of the second ball grid array pad 123 does not overlap the center 122C of the second through hole 122.

In the embodiment, the circuit structure 100 may further include a core layer 160, an insulating layer 171, an insulating layer 181, a conductive layer 172, and a conductive layer 182. The first through hole 112 and the second through hole 122 penetrate the core layer 160. The core layer 160 has a first surface 160a and a second surface 160b that are opposite to each other. The conductive layer 172 and the insulating layer 171 are disposed on the first surface 160a of the core layer 160. The conductive layer 182 and the insulating layer 181 are disposed on the second surface 160b of the core layer 160. The conductive layer 172 may be one conductive layer or a plurality of conductive layers, and/or the conductive layer 182 may be one conductive layer or a plurality of conductive layers, and the invention is not limited thereto.

In the embodiment, if the conductive layer 172 is a plurality of conductive layers, the plurality of conductive layers 172 may be separated from each other by the insulating layer 171, and different conductive layers 172 can be electrically connected to each other by corresponding conductive vias 173. For example, the first through hole 112 and the first line segment 111 can be electrically connected to each other by the corresponding conductive vias 173 between the first through hole 112 and the first line segment 111.

In the embodiment, if the conductive layer 182 is a plurality of conductive layers, the plurality of conductive layers 182 may be separated from each other by the insulating layer 181, and different conductive layers 182 can be electrically connected to each other by corresponding conductive vias 183. For example, the first through hole 112 and the first ball grid array pad 113 may be electrically connected to each other by the corresponding conductive via 183 between the first through hole 112 and the first ball grid array pad 113.

In the embodiment, the conductive via 173 and/or the conductive via 183 is, for example, a buried via hole (BVH), but the invention is not limited thereto.

In the embodiment, the first line segment 111 of the first signal line 110, the second line segment 121 of the second signal line 120, the third line segment 131 of the third signal line 130, and the fourth line segment 141 of the fourth signal line 140 may be the same film layer.

In the embodiment, the first line segment 111 of the first signal line 110, the second line segment 121 of the second signal line 120, the third line segment 131 of the third signal line 130, and the fourth line segment 141 of the fourth signal line 140 may be a portion of the topmost conductive layer 172 that is one of the conductive layers 172 on the first surface 160a of the core layer 160 and furthest from the first surface 160a.

In the embodiment, the first ball grid array pad 113 of the first signal line 110, the second ball grid array pad 123 of the second signal line 120, the third ball grid array pad 133 of the third signal line 130, and the fourth ball grid array pad 143 of the fourth signal line 140 may be the same film layer.

In the embodiment, the first ball grid array pad 113 of the first signal line 110, the second ball grid array pad 123 of the second signal line 120, the third ball grid array pad 133 of the third signal line 130, and the fourth signal line 140 may be a portion of the bottommost conductive layer 182 that is one of the conductive layers 182 on the second surface 160b of the core layer 160 and furthest from the second surface 160b.

In the embodiment, the core layer 160 may include a polymer glass fiber composite substrate, a glass substrate, a ceramic substrate, a silicon-on-insulator substrate, or a polyimide (PI) glass fiber composite substrate, but the invention is not limited thereto. The through hole(s) penetrating the core layer 160 (e.g., the first through holes 112 and the second through holes 122) may be referred to as core via hole(s).

In the embodiment, the first through hole 112 of the first signal line 110, the second through hole 122 of the second signal line 120, the third through hole 132 of the third signal line 130, and the fourth through hole 142 of the fourth signal line 140 may be a solid conductive pillar, but the invention is not limited thereto. In an embodiment, the first through hole 112 of the first signal line 110, the second through hole 122 of the second signal line 120, the third through hole 132 of the third signal line 130, and the fourth through hole 142 of the fourth signal line 140 may be a hollow plating through hole (PTH); alternatively, the plug hole resin or the polymer glass ceramic hybrid material may be filled in the plating through hole, and the invention is not limited thereto. In an embodiment, the conductive material of the through holes (e.g., the first through holes 112 and the second through holes 122) and the conductive layer 172 contacting the first surface 160a and/or the conductive layer 182 contacting the second surface 160b may be formed in the same process.

In the embodiment, the thickness of the first through hole 112 and the thickness of the second through hole 122 are larger than the thickness of the conductive via 173 and the thickness of the conductive via 183.

In an embodiment, the thickness 160h of the core layer 160 may be on the order of hundreds of micrometers (μm); and the thickness of the conductive layer 172, the thickness of the conductive layer 182, the thickness of the conductive via 173, and the thickness of the conductive via 183 may be on the order of tens to thousands of nanometers (nm). That is, the thickness of the conductive layer 172, the thickness of the conductive layer 182, the thickness of the conductive via 173, and the thickness of the conductive via 183 may be very thin compared to the thickness 160h of the core layer 160.

In the embodiment, the structure can be designed such that the conductors of the two signal lines of the differential pair can be impedance matching. In this way, when the high-frequency signal transmission is performed by the differential pair, the reflected noise during the transmission may be reduced.

For example, the line connecting the center 113C of the first ball grid array pad 113 and the center 133C of the third ball grid array pad 133 has a third distance L3, the line connecting the center 112C of the first through hole 112 and the center 132C of the third through hole 132 has a fourth distance L4, and the fourth distance L4 is smaller than the third distance L3. In the current path of the first signal line 110, the first through hole 112 may be the conductor having the largest thickness. In the current path of the third signal line 130, the third through hole 132 may be the conductor having the largest thickness. Therefore, the parasitic capacitance between the first through hole 112 and the third through hole 132 may be improved by the adjustment of the fourth distance L4, as such the impedance between the vertical current path (e.g., the current path between the first line segment 111 and the first ball grid array pad 113 and the current path between the third line segment 131 and the third ball grid array pad 133) of the first differential pair DP1 may be approached the impedance between the horizontal current path (e.g., the current path of the first line segment 111 and the current path of the third line segment 131) of the first differential pair DP1.

In the embodiment, in a top view direction, the center 113C of the first ball grid array pad 113 does not overlap the center 112C of the first through hole 112, and the center 133C of the third ball grid array pad 133 does not overlap the center 132C of the third via hole 132, but the invention is not limited thereto.

For example, the line connecting the center 123C of the second ball grid array pad 123 and the center 143C of the fourth ball grid array pad 143 has a fifth distance L5, the line connecting the center 122C of the second through hole 122 and the center 142C of the fourth through hole 142 has a sixth distance L6, and the sixth distance L6 is smaller than the fifth distance L5. In the current path of the second signal line 120, the second through hole 122 may be the conductor having the largest thickness. In the current path of the fourth signal line 140, the fourth through hole 142 may be the conductor having the largest thickness. Therefore, the parasitic capacitance between the second through hole 122 and the fourth through hole 142 may be improved by the adjustment of the sixth distance L6, as such the impedance between the vertical current path (e.g., the current path between the second line segment 121 and the second ball grid array pad 123 and the current path between the fourth line segment 141 and the fourth ball grid array pad 143) of the second differential pair DP2 may be approached the impedance between the horizontal current path (e.g., the current path of the second line segment 121 and the current path of the fourth line segment 141) of the second differential pair DP2.

In the embodiment, in a top view direction, the center 123C of the second ball grid array pad 123 does not overlap the center 122C of the second through hole 122, and the center 143C of the fourth ball grid array pad 143 does not overlap the center 142C of the fourth through hole 142, but the invention is not limited thereto.

Figure 5:
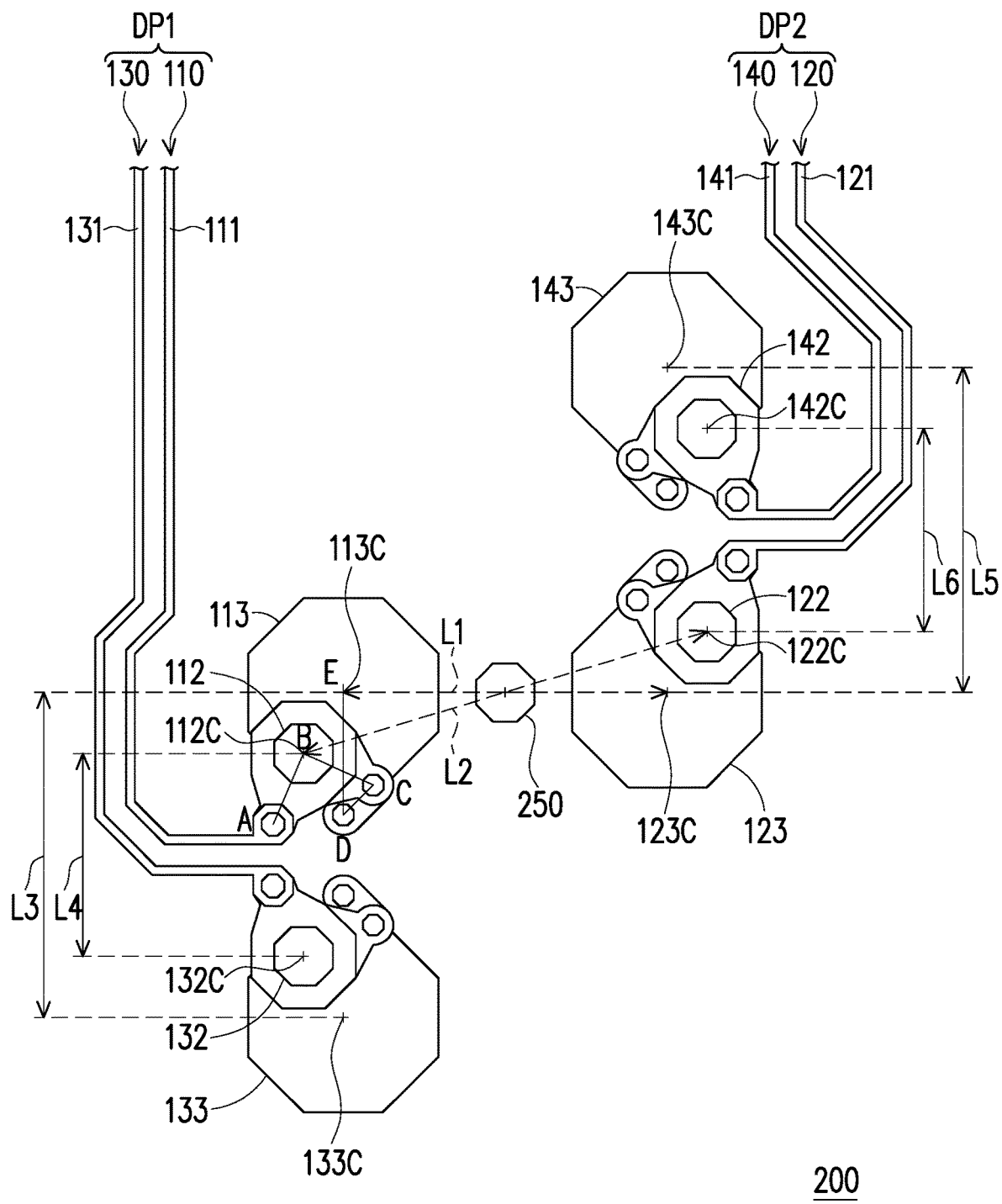
FIG. 5 is a partial top view of a circuit structure according to a second embodiment of the invention.

FIG. 5 is a partial top view of a circuit structure according to a second embodiment of the invention. The circuit structure 200 of the present embodiment is similar to the circuit structure 100 of the first embodiment, and similar elements are denoted by the same reference numerals, and have similar functions, materials, or formation methods, and the description is omitted.

The circuit structure 200 of the present embodiment is similar to the circuit structure 100 of the first embodiment, with the difference that the circuit structure 200 may further include a ground via 250.

The ground via 250 is disposed between the first signal line 110 and the second signal line 120. The ground via 250 may be shield ground or electrically connected to a ground terminal. The ground via 250 penetrates the core layer 160. The ground via 250 may be a solid conductive pillar or a hollow plated through hole, which is not limited in the present invention.

In the embodiment, the ground via 250 is disposed on the line connecting the center 112C of the first through hole 112 and the center 122C of the second through hole 122 in a top view direction. In this way, when the high-frequency signal transmission is performed by the circuit structure 200, the signal interference between the first signal line 110 and the second signal line 120 may be reduced.

In the embodiment, there may be no conductive terminal (not shown because there is none) disposed on the ground via 250.

Comparative Example and Test Examples

In order to prove that the circuit structure of the present invention can improve the signal transmission quality of the high-frequency signal, a comparative example and test examples are specifically described by software simulation. However, these test examples are not intended to limit the invention.

Test example 1 is simulated with the circuit structure 100 of the first embodiment. Test example 2 is simulated with the circuit structure 200 of the second embodiment.

Figure 6:
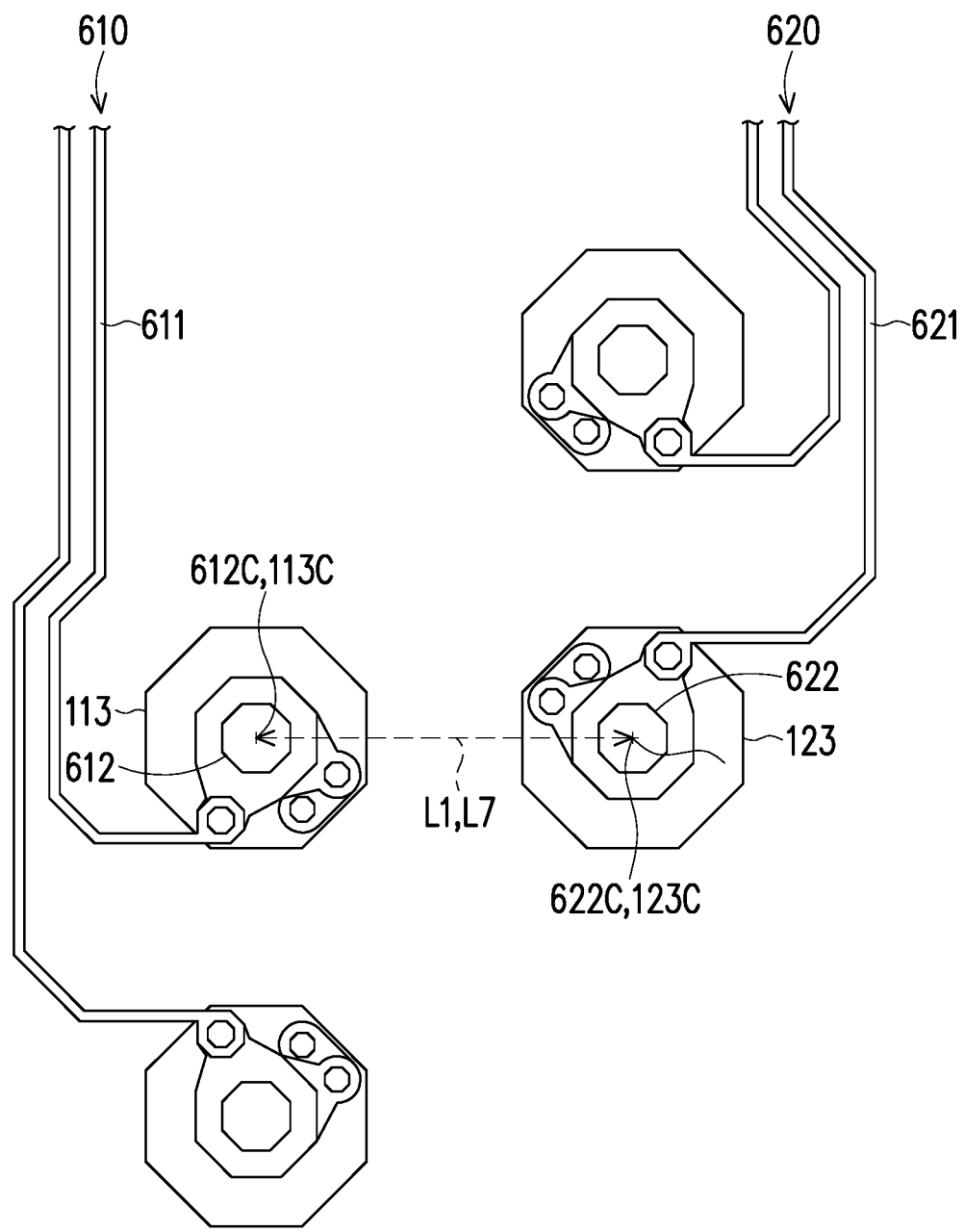
FIG. 6 is a partial top view of a circuit structure according to a comparative example.

The circuit structure 600 of the comparative example includes a first signal line 610 and a second signal line 620. The first signal line 610 includes a first line segment 611, a first through hole 612, and a first ball grid array pad 113. The first through hole 612 is disposed between the first line segment 611 and the first ball grid array pad 113, and the first through hole 612 is electrically connected to the first line segment 611 and the first ball grid array pad 113. The second signal line 620 includes a second line segment 621, a second through hole 622, and a second ball grid array pad 123. The second through hole 622 is disposed between the second line segment 621 and the second ball grid array pad 123, and the second through hole 622 is electrically connected to the second line segment 621 and the second ball grid array pad 123. In a top view direction (as shown in FIG. 6), the line connecting the center 113C of the first ball grid array pad 113 and the center 123C of the second ball grid array pad 123 has a first distance L1, the line connecting the center 612C of the first through hole 612 and the center 622C of the second through hole 622 has a seventh distance L7, and the first distance L1 is equal to the seventh distance L7. There is no ground via (such as a ground via similar to the ground via 250) between the first signal line 610 and the second signal line 620.

In general, the signal transmission quality of two adjacent conductors can be described by the isolation of the signals they transmit. In terms of numerical description, the isolation can be expressed in decibels (dB). That is to say, in the description of the value, the larger absolute value of the isolation, the better transmission quality of the signal.

Figure 7:
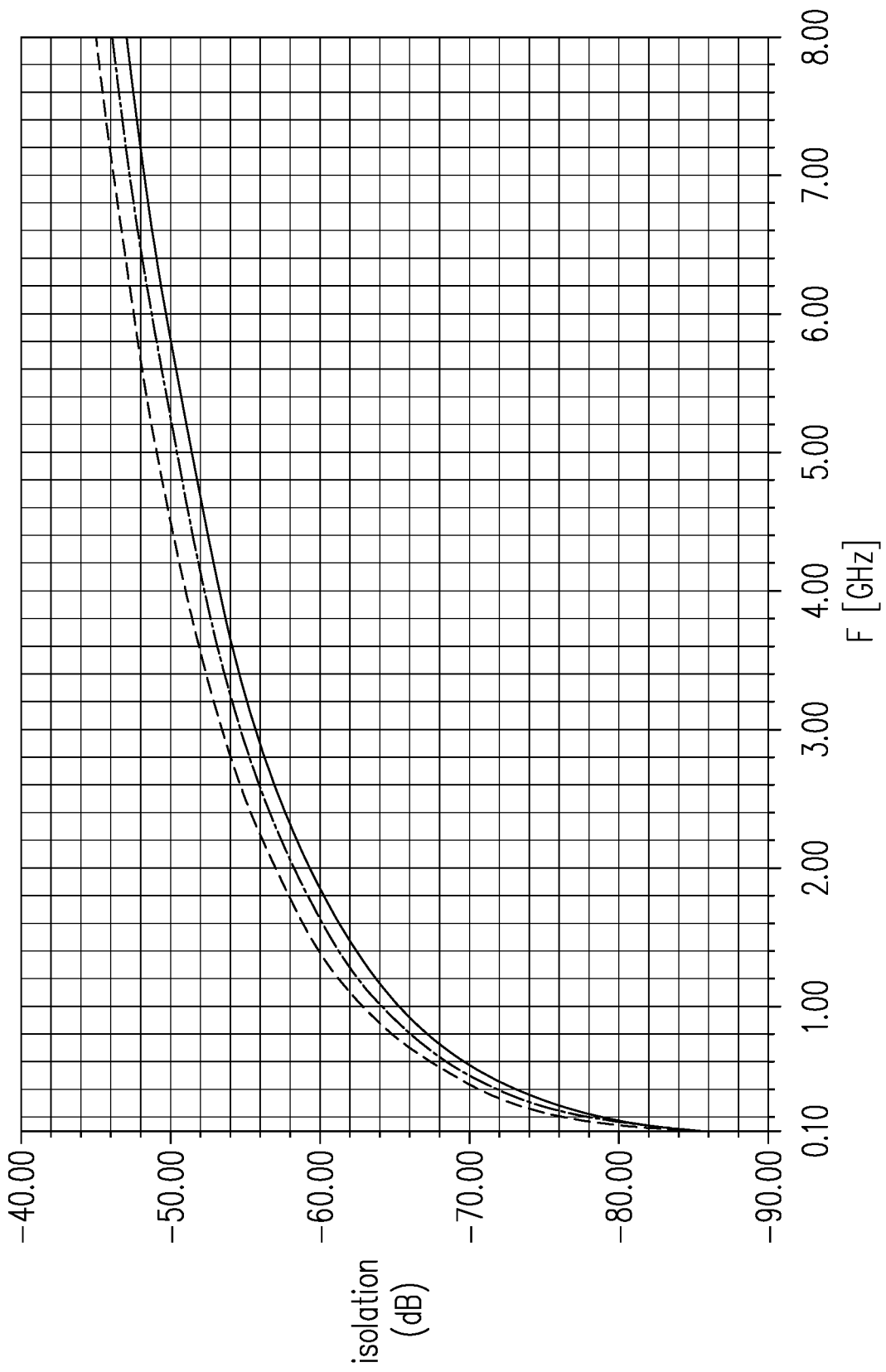
FIG. 7 is a graph showing a simulation of signal isolation at different transmission frequencies of the circuit structure of the comparative example and the circuit structures of the test examples.

In FIG. 7, the dash line may be the isolation of the signals of different frequencies of at least one of the first signal line 610 or the second signal line 620 of the comparative example in the differential mode; the dash-dot line may be the isolation of the signals of different frequencies of at least one of the first signal line 110 or the second signal line 120 of the test example 1 in the differential mode; and the solid line may be the isolation of the signals of different frequencies of at least one of the first signal line 110 or the second signal line 120 of the test example 2 in the differential mode.

As shown in FIG. 7, the circuit structure 100 of the test example 1 and the circuit structure 200 of the test example 2 may have better signal transmission quality than the circuit structure 600 of the comparative example.

In general, the signal transmission performance of a conductor can be described by the insertion loss and return loss of the signal it transmits. In terms of numerical description, the insertion loss and the return loss can be expressed in decibels. That is to say, in the description of the value, the smaller absolute value of the insertion loss, the better transmission quality of the signal; and the larger absolute value of the return loss, the better transmission quality of the signal.

Figure 8:
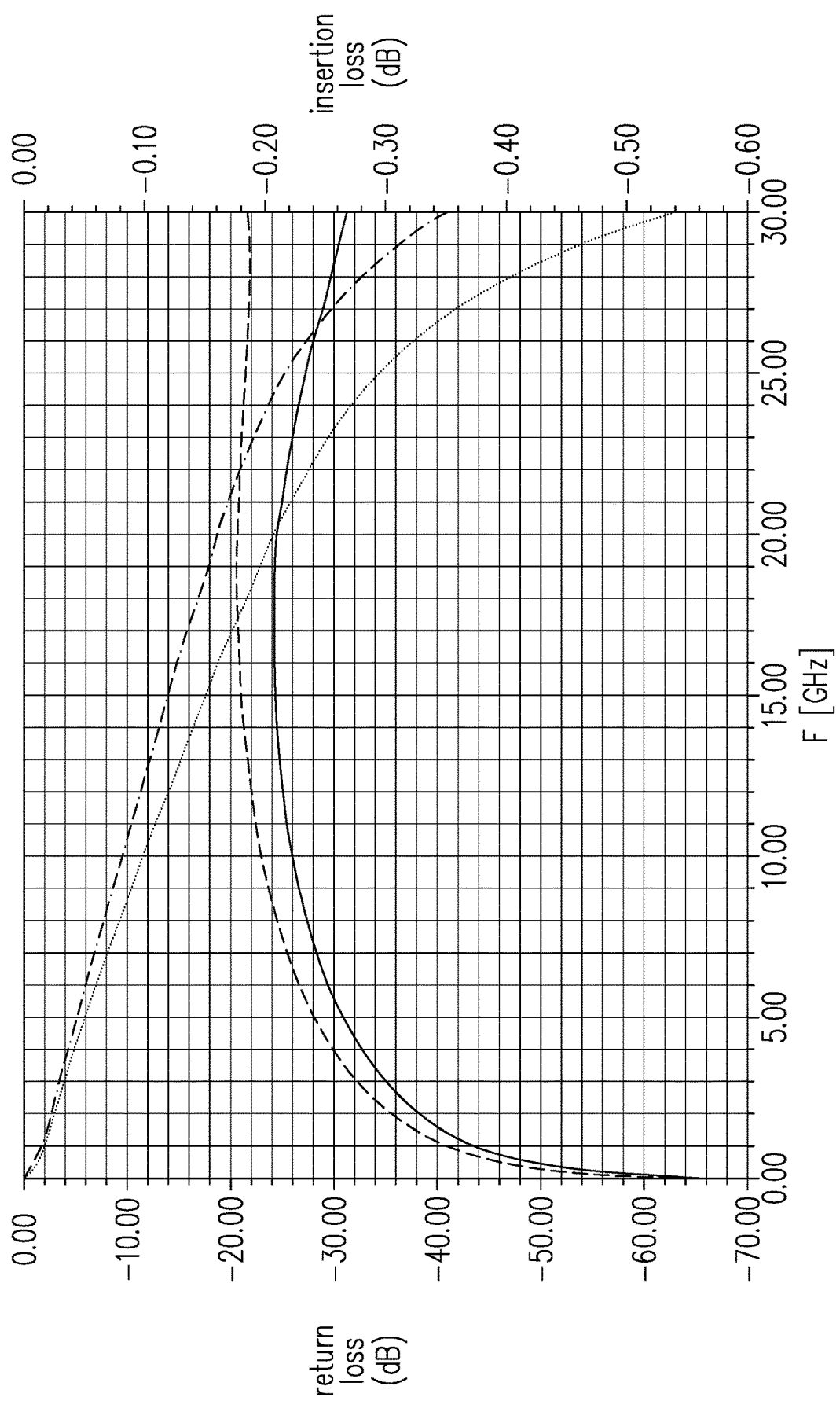
FIG. 8 is a graph showing a simulation of signal loss at different transmission frequencies of the circuit structure of the comparative example and the circuit structure of the test example.

In FIG. 8, the dash line may be the return loss of the signals of different frequencies of at least one of the first signal line 610 or the second signal line 620 of the comparative example in the differential mode; the solid line may be the return loss of the signals of different frequencies of at least one of the first signal line 110 or the second signal line 120 of the test example 2 in the differential mode; the dot line may be the insertion loss of the signals of different frequencies of at least one of the first signal line 610 or the second signal line 620 of the comparative example in the differential mode; and the dash-dot line may be the insertion loss of the signals of different frequencies of at least one of the first signal line 110 or the second signal line 120 of the test example 2 in the differential mode.

As shown in FIG. 8, the circuit structure 200 of the test example 2 may have better signal transmission quality than the circuit structure 600 of the comparative example.

In summary, the circuit structure of the present invention and the chip package having the same can have better signal transmission quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit structure, comprising:
a first signal line, comprising a first line segment, a first ball grid array pad, and a first through hole disposed between the first line segment and the first ball grid array pad;
a second signal line, comprising a second line segment, a second ball grid array pad, and a second through hole disposed between the second line segment and the second ball grid array pad, wherein in a top view direction:
a line connecting the center of the first ball grid array pad and the center of the second ball grid array pad has a first distance;
a line connecting the center of the first through hole and the center of the second through hole has a second distance; and
the first distance is less than the second distance;
a third signal line, forming a first differential pair with the first signal line; and
a fourth signal line, forming a second differential pair with the second signal line.

2. The circuit structure of claim 1, wherein the first ball grid array pad, the second ball grid array pad, the first through hole, and the second through hole are disposed between the first line segment and the second line segment.

3. The circuit structure of claim 1, wherein in the top view direction, the center of the first ball grid array pad does not overlap the center of the first through hole, and the center of the second ball grid array pad does not overlap the center of the second via hole.

4. The circuit structure of claim 1, further comprising:
a ground via, disposed between the first signal line and the second signal line.

5. The circuit structure of claim 4, wherein in the top view direction, the ground via is disposed on a line connecting the center of the first through hole and the center of the second through hole.

6. The circuit structure of claim 1, wherein the first differential pair is capable of transmitting a transmission signal having a frequency in a range of 1 GHz to 30 GHz, and the second differential pair is capable of transmitting a transmission signal having a frequency in a range of 1 GHz to 30 GHz.

7. The circuit structure of claim 1, further comprising:
a core layer, wherein the first through hole and the second through hole penetrate the core layer.

8. The circuit structure of claim 1, wherein the first signal line further comprises a conductive via between the first through hole and the first line segment, and the thickness of the first through hole is greater than the thickness of the conductive via.

9. The circuit structure of claim 1, wherein the first signal line further comprises a conductive via hole between the first through hole and the first ball grid array pad, and the thickness of the first through hole is greater than the thickness of the conductive via.

10. A chip package, comprising:
a chip, having an active surface;
a circuit structure, disposed on the active surface of the chip and electrically connected to the chip, the circuit structure comprising:
a first signal line, comprising a first line segment, a first ball grid array pad, and a first through hole disposed between the first line segment and the first ball grid array pad;
a second signal line, comprising a second line segment, a second ball grid array pad, and a second through hole disposed between the second line segment and the second ball grid array pad, wherein in a top view direction:
a line connecting the center of the first ball grid array pad and the center of the second ball grid array pad has a first distance;
a line connecting the center of the first through hole and the center of the second through hole has a second distance; and
the first distance is less than the second distance;
a third signal line, forming a first differential pair with the first signal line; and
a fourth signal line, forming a second differential pair with the second signal line; and
a plurality of conductive terminals, disposed on the first ball grid array pad and the second ball grid array pad of the circuit structure.

11. The chip package of claim 10, wherein the first ball grid array pad, the second ball grid array pad, the first through hole, and the second through hole are disposed between the first line segment and the second line segment.

12. The chip package of claim 10, wherein in the top view direction, the center of the first ball grid array pad does not overlap the center of the first through hole, and the center of the second ball grid array pad does not overlap the center of the second via hole.

13. The chip package of claim 10, the circuit structure further comprising:
a ground via, disposed between the first signal line and the second signal line.

14. The chip package of claim 13, wherein in the top view direction, the ground via is disposed on a line connecting the center of the first through hole and the center of the second through hole.

15. The chip package of claim 10, wherein the first differential pair is capable of transmitting a transmission signal having a frequency in a range of 1 GHz to 30 GHz, and the second differential pair is capable of transmitting a transmission signal having a frequency in a range of 1 GHz to 30 GHz.

16. The chip package of claim 10, the circuit structure further comprising:
a core layer, wherein the first through hole and the second through hole penetrate the core layer.

17. The chip package of claim 10, wherein the first signal line further comprises a conductive via between the first through hole and the first line segment, and the thickness of the first through hole is greater than the thickness of the conductive via.

18. The chip package of claim 10, wherein the first signal line further comprises a conductive via hole between the first through hole and the first ball grid array pad, and the thickness of the first through hole is greater than the thickness of the conductive via.

* * * * *